(12) United States Patent
Gao et al.

(10) Patent No.: US 9,041,391 B2
(45) Date of Patent: May 26, 2015

(54) PARTIAL MAGNETIC BIASING OF MAGNETORESISTIVE SENSOR

(75) Inventors: Kaizhong Gao, Shoreview, MN (US);
Jiexuan He, Plymouth, MN (US);
Jiaoming Qiu, Maple Grove, MN (US)

(73) Assignee: Seagate Technology LLC, Cupertino, CA (US)

( * ) Notice: Subject to any disclaimer, the term of this patent is extended or adjusted under 35 U.S.C. 154(b) by 658 days.

(21) Appl. No.: 13/194,828

(22) Filed: Jul. 29, 2011

(65) Prior Publication Data

US 2013/0027032 A1    Jan. 31, 2013

(51) Int. Cl.
*G01R 33/02* (2006.01)
*G01R 33/09* (2006.01)

(52) U.S. Cl.
CPC ..................... *G01R 33/093* (2013.01)

(58) Field of Classification Search
CPC .................. G01R 3/09; G01R 3/093
See application file for complete search history.

(56) References Cited

U.S. PATENT DOCUMENTS

| 7,035,062 | B1 | 4/2006 | Mao et al. |
| 7,054,085 | B2 | 5/2006 | Lin et al. |
| 7,061,731 | B2 * | 6/2006 | Larson et al. ............ 360/324.12 |
| 7,173,795 | B2 | 2/2007 | Garfunkel |
| 7,177,122 | B2 | 2/2007 | Hou et al. |
| 2004/0061981 | A1 | 4/2004 | Covington |
| 2004/0071077 | A1 | 4/2004 | Aoishi |
| 2009/0257154 | A1 | 10/2009 | Carey et al. |
| 2010/0097729 | A1 | 4/2010 | Gill et al. |
| 2011/0007426 | A1 | 1/2011 | Qiu et al. |
| 2011/0134572 | A1 * | 6/2011 | Qiu et al. ..................... 360/313 |

* cited by examiner

*Primary Examiner* — Reena Aurora
(74) *Attorney, Agent, or Firm* — Hall Estill Attorneys at Law

(57) ABSTRACT

Various embodiments can be generally directed to a magnetoresistive stack with a first stripe height and a biasing magnet positioned adjacent the magnetoresistive stack. The biasing magnet can have a second stripe height that is less than the first stripe height. The first and second stripe heights may correspond to a minimum signal to noise ratio in the magnetoresistive stack.

20 Claims, 9 Drawing Sheets

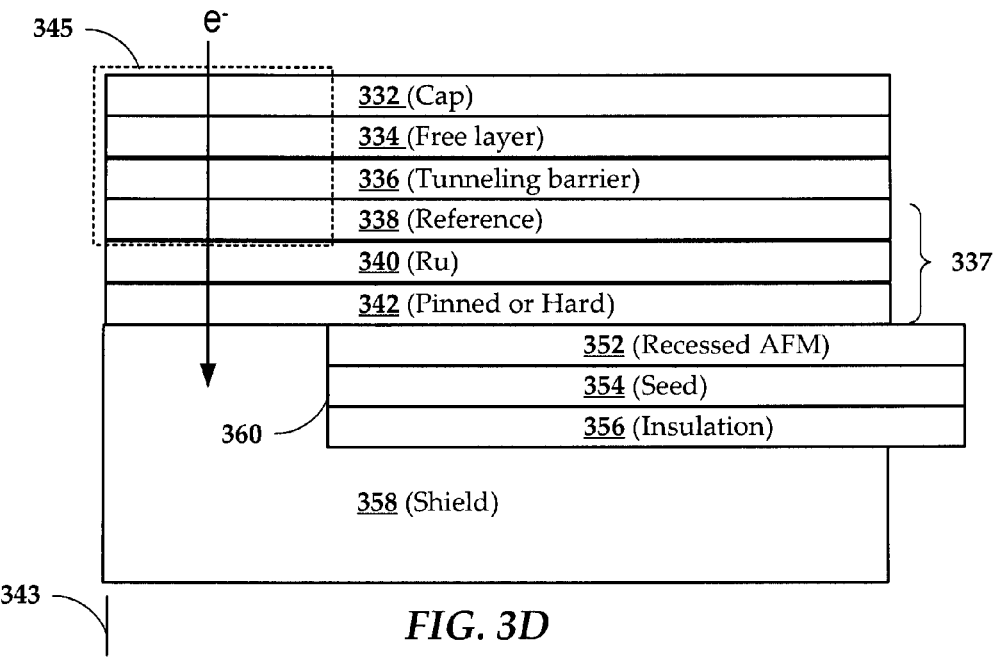
*FIG. 3D*
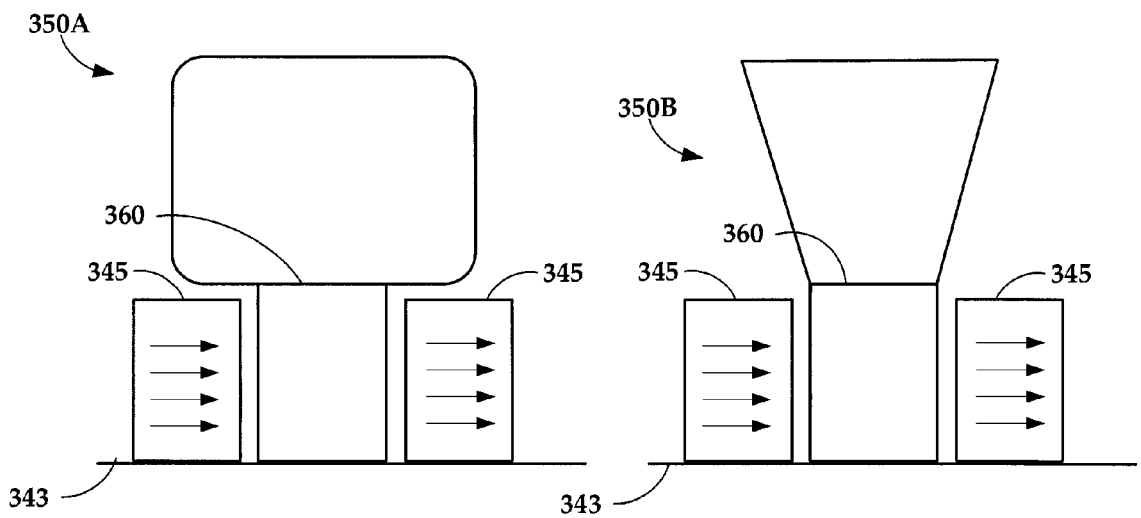
*FIG. 3E*  *FIG. 3F*

PARTIAL MAGNETIC BIASING OF MAGNETORESISTIVE SENSOR

SUMMARY

A magnetoresistive stack may be constructed with a first stripe height and a biasing magnet positioned adjacent the magnetoresistive stack. The biasing magnet can have a second stripe height that is less than the first stripe height. The first and second stripe heights may correspond to a minimum signal to noise ratio in the magnetoresistive stack.

BRIEF DESCRIPTION OF THE DRAWINGS

The discussion below makes reference to the following figures, wherein the same reference number may be used to identify the similar/same component in multiple figures.

FIGS. 3A-3D are side views of MR reader stack arrangements according to example embodiments;

FIGS. 3E-3F are front views of MR reader stack arrangements according to example embodiments;

DETAILED DESCRIPTION

Figure 1:
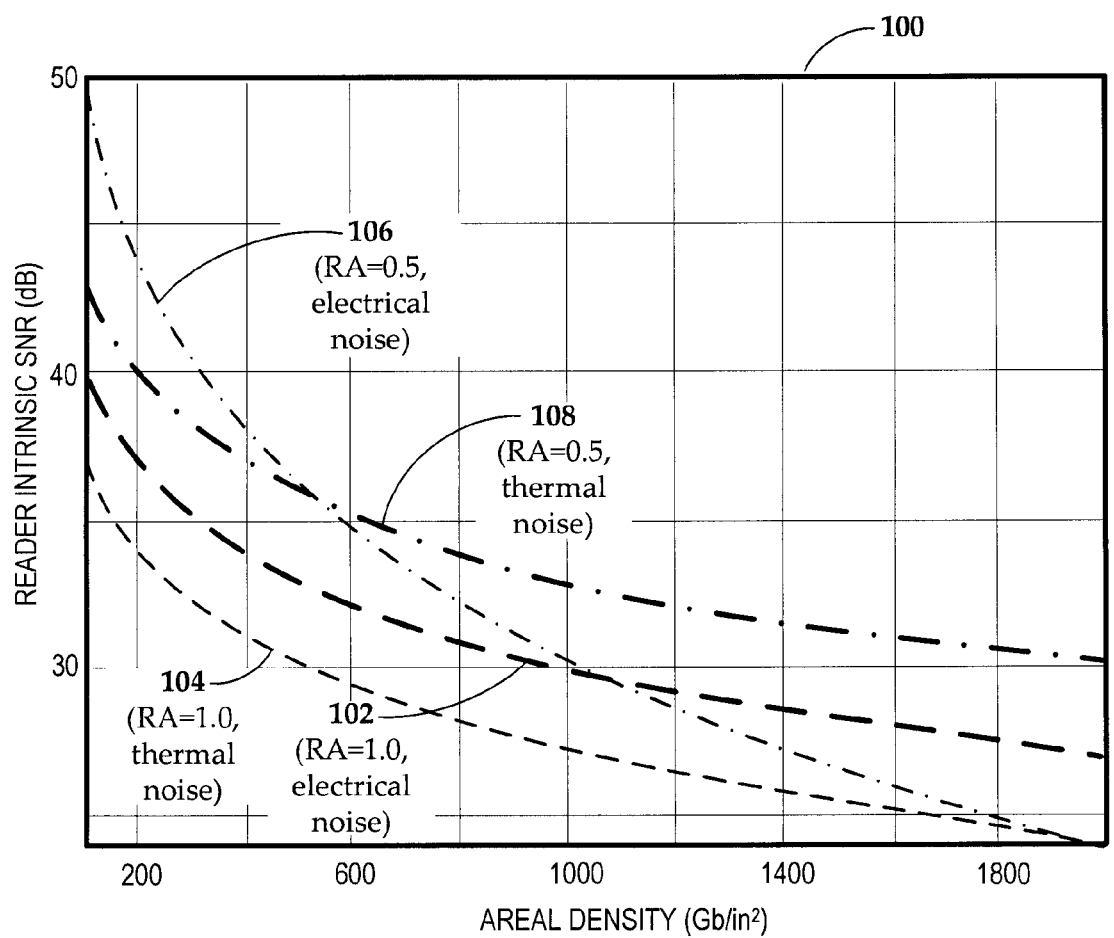
FIG. 1 is a graph illustrating estimates of intrinsic signal-to-noise ratios that may be applicable to example reader head embodiments described herein.

The present disclosure relates generally to biasing one or more free layers of a magnetoresistive sensor stack. In some magnetic data storage and retrieval system, a magnetic recording head a magnetoresistive (MR) read sensor for retrieving magnetically encoded information stored on a magnetic disc. Magnetic flux from the surface of the disc causes rotation of the magnetization vector of a sensing layer (or layers) of the MR sensor, which in turn causes a change in electrical resistivity of the MR sensor. The sensing layers are often called "free" layers, since the magnetization vectors of the sensing layers are free to rotate in response to external magnetic flux. The change in resistivity of the MR sensor can be detected by passing a current through the MR sensor and measuring a voltage across the MR sensor. External circuitry then converts the voltage information into an appropriate format and manipulates that information as necessary to recover the information encoded on the disc. While the present embodiments are described in terms of magnetic media read sensors, it will be appreciated that the concepts described hereinbelow may be applicable to other similar sensors known in the art.

Magnetoresistive sensors have been developed that can be characterized in three general categories: (1) anisotropic magnetoresistive (AMR) sensors, (2) giant magnetoresistive (GMR) sensors, including spin valve sensors and multilayer GMR sensors, and (3) tunneling magnetoresistive (TMR) sensors. AMR sensors generally have a single MR layer formed of a ferromagnetic material. The resistance of the MR layer varies as a function of the angle formed between the magnetization vector of the MR layer and the direction of the sense current flowing in the MR layer.

A GMR sensor has a series of alternating magnetic and nonmagnetic layers. The resistance of GMR sensors varies as a function of the spin-dependent transmission of the conduction electrons between the magnetic layers separated by the nonmagnetic layer and the accompanying spin-dependent scattering which takes place at the interface of the magnetic and nonmagnetic layers and within the magnetic layers. The resistance of a GMR sensor depends on the relative orientations of the magnetization in consecutive magnetic layers, and varies as the cosine of the angle between the magnetization vectors of consecutive magnetic layers.

A TMR sensor is configured similar to a GMR sensor, except that the magnetic layers of the sensor are separated by an insulating film thin enough to allow electron tunneling between the magnetic layers. The tunneling probability of an electron incident on the barrier from one magnetic layer depends on the character of the electron wave function and the spin of the electron relative to the magnetization direction in the other magnetic layer. As a consequence, the resistance of the TMR sensor depends on the relative orientations of the magnetization of the magnetic layers, exhibiting a minimum for a configuration in which the magnetizations of the magnetic layers are parallel and a maximum for a configuration in which the magnetizations of the magnetic layers are anti-parallel.

For these types of MR sensors, magnetization rotation occurs in response to magnetic flux from the disc. As the recording density of magnetic discs continues to increase, the width of the tracks on the disc may decrease, which in turn may necessitate smaller and smaller MR sensors. As MR sensors become smaller in size, particularly for sensors with dimensions less than about 0.1 micrometers, the sensors have the potential to exhibit an undesirable magnetic response to applied fields from the magnetic disc. Magnetoresistive sensors should be designed in such a manner that even small sensors are free from magnetic noise and provide a signal with adequate amplitude for accurate recovery of the data written on the disc.

The present disclosure is directed to techniques for improving performance of a magnetoresistive (MR) sensor, such as reader heads utilized in persistent data storage and retrieval devices. The present disclosure describes an arrangement of one or more permanent magnets that improves output performance of a high areal density, MR reader. In some embodiments, a biasing magnet is configured to have a different edge dimension than a free layer of an MR stack that is being biased by the magnet. For example, a permanent magnet may be smaller than a height of the MR stack and positioned near a media reading edge of the stack. These configurations can help improve reader performance, such as by optimizing a signal-to-noise ratio of the MR reader.

It is desirable to reduce the reader junction area (RA) of an MR sensor in order to utilize a smaller area to store an individual bit of data. However, the reader area cannot be reduced indefinitely without penalty. For high areal density magnetic recording, it has been predicted that reader noise is inversely proportional to the reader junction area. This is because electric noise increases with electrical resistance of the reader, and reader resistance increases as reader area decreases.

In reference to FIG. 1, a graph 100 illustrates estimates of intrinsic signal-to-noise ratio (SNR) that may be applicable to various reader head configurations described herein. Curves 102 and 104 represent respective components of electrical noise and thermal noise for a MR reader head (e.g., TMR) with RA=1.0 ohm/$\mu m^2$. Curves 106 and 108 represent respective components of electrical noise and thermal noise for a similar MR reader head with RA=0.5 ohm/$\mu m^2$. As this graph 100 illustrates, the intrinsic SNR for a given reader design may drop monotonically with increase of areal density due to each noise term increasing monotonically with reduction of bit size.

For current MR stack designs, reader resistance may increase to an intolerable level when attempting to achieve high areal densities. For example, it may be difficult to achieve acceptable SNR levels using existing readers as areal density approaches 1 Tb/$in^2$ (500 ktpi plus). Thus, it is desirable to explore alternate stack configurations with lower reader resistance, which may exhibit a correspond reduction in reader noise. One way to do this is to increase reader width of the stack. However, increasing reader width may not be a practical option due to resolution limits of high areal density reader systems. In order to achieve a high resolution, smaller reader width and reader shield-to shield spacing may be preferable.

Figure 2:
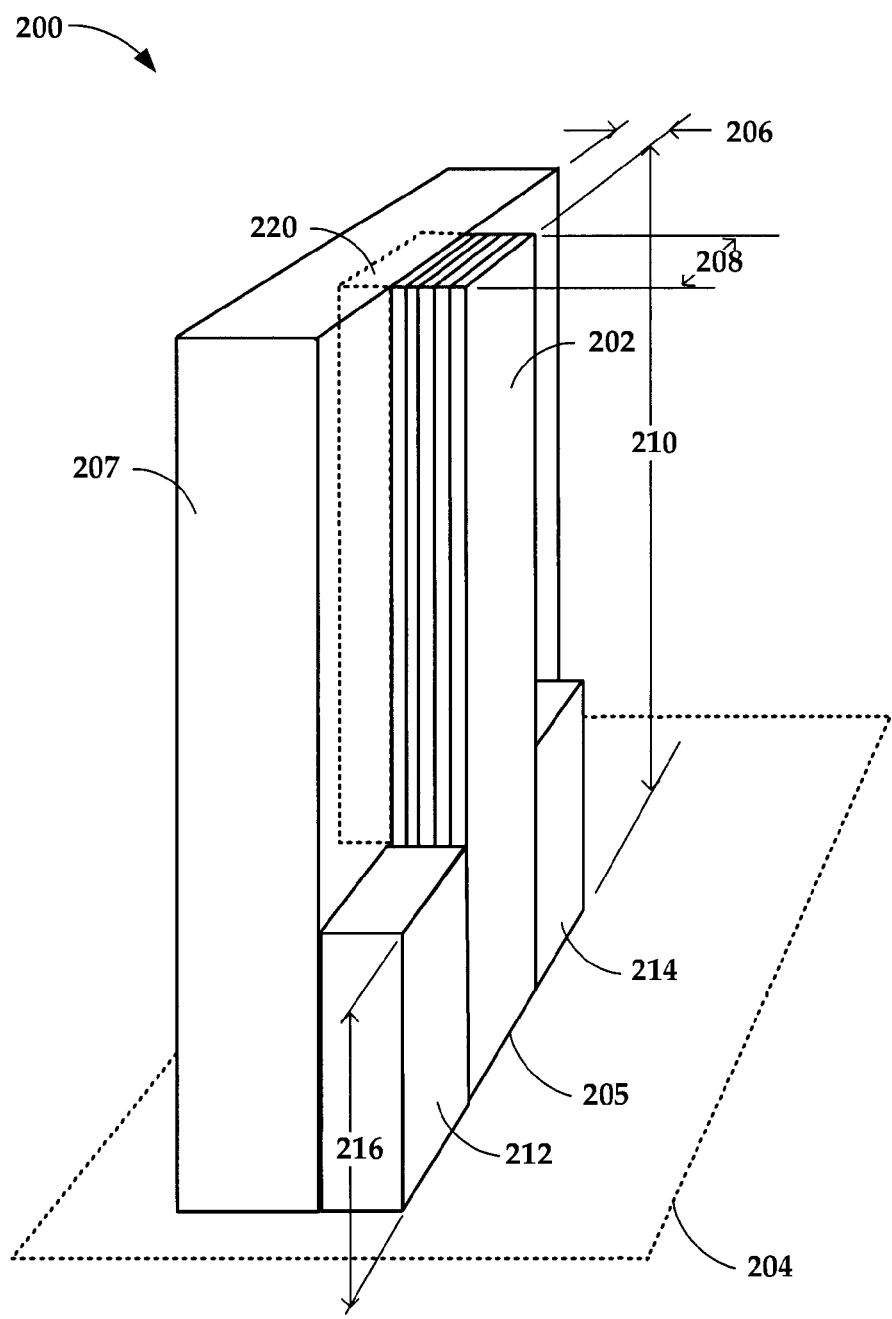
FIG. 2 is a perspective view of a magnetoresistive (MR) reader arrangement according to an example embodiment.

In reference now to FIG. 2, a perspective view shows a MR reader arrangement 200 according to an example embodiment. A stack 202 includes multiple layers according to any number of MR stack designs, including GMR, TMR, and a tri-layer MR head design that will be described in greater detail below. The stack 202 is shown positioned relative to a media surface 204, such as the surface of a hard drive disk. In such an arrangement, an edge 205 of the stack 202 located proximate the media surface 204 may generally correspond to an air bearing surface of a slider that encompasses the reader arrangement 200.

The reader 100 is generally surrounded top and bottom by shielding layers, such as shield 207 (the opposite shield is omitted for purposes of clarity). It should be noted that the terminology "top" and "bottom" is used because the stack 202 and corresponding components of the reader 200 are typically formed by depositing layers onto a substrate, and so the relative locations of the reader components are often referenced relative to a top-to-bottom order in which layers are deposited. The top-to-bottom direction in such a case would correspond to a left-to-right (or right-to-left) direction in the orientation shown in FIG. 2.

The reader area of the stack corresponds to the product of shield-to-shield spacing 206 and stack width 208. As previously discussed, it is desirable to reduce these dimensions 206, 208 in order to increase resolution of the reader 200. In one embodiment, the stack has a high aspect ratio, e.g., reader height 210 versus reader width 208 as measured at least at the air bearing surface 205. In some configurations, this aspect ratio may be 3:1 or larger. The elongated stack 202 may provide some enhanced performance in terms of stack resistance, stability, and sensitivity.

Another aspect of the reader design relates to permanent magnets 212, 214 that are located proximate the stack 202. The permanent magnets 212, 214 are used to bias one or more free layers of the stack 202 to maximize sensitivity of the free layers to a changing magnetic field at the media surface 204. In this example, the permanent magnets 212, 214 have a height dimension 216 that is different than reader height 210. Specifically in this example, the magnet height 216 is significantly less than reader height 210, and the magnets 212, 214 are located proximate the air bearing surface 205. While magnets 212 and 214 are shown in this figure as having the same height 216, it will be appreciated that in some configurations these magnets 212, 214 may have different heights. As will be described in greater detail below, this combination of magnet height and location is just one example of an arrangement that may improve SNR of the reader 200.

Also seen in FIG. 2 is an optional insulation layer 220 that may be included as part of the arrangement. As will be described herein, the insulation layer 220 may provide improved signal-to-noise ratio (SNR). The insulation layer 220 may extend along the side of the stack across stack width 208 and may be disposed on both sides of the stack 202. The bottom edge of the insulation layer 220 extends from the top edge of the stack 202 to the top edge of the permanent magnets 212, 214. There may be some overlap between the insulator 220 and permanent magnets 212, 214 in some configurations, and there may be a vertical gap between the insulator 220 and permanent magnets 212, 214 in other configurations.

Figure 3A:
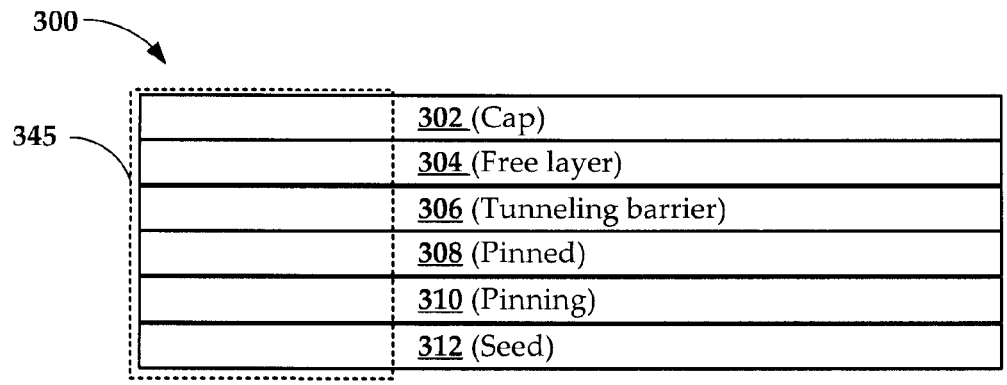

The arrangements shown herein may be applicable to any MR stack design, although the present disclosure focuses on TMR and tri-layer designs. In FIG. 3A, a block diagram illustrates a TMR stack 300 according to an example embodiment. Stack 300 includes a cap/contact layer 302, a free layer 304, an insulating layer/tunneling barrier 306, a reference/pinned layer 308, an antiferromagnetic (AFM) pinning layer 310, and a seed/contact layer 312. The pinned layer 308 has a magnetization that is pinned in a predetermined orientation by the pinning layer 310.

Permanent magnets (e.g., magnets 212 and 214 in FIG. 2, and represented here by way of reference number 345) are positioned on opposite sides of stack 300 to fix a magnetic orientation of free layer 304 relative to a surface of the memory media. Top and bottom shields (not shown) are respectively located proximate to the cap and seed layers 302, 312. The shields may be configured as electrodes, or separate electrodes may be positioned to provide current to the stack 300. During operation, a current flows from top to bottom of the stack 300, e.g., from cap 302 layer 302 to seed layer 312, or vice versa. This current is used to determine changes in resistance of the stack 300 due to magnetic fluctuation of the media, thereby providing an output signal of the MR reader.

Figure 3B:
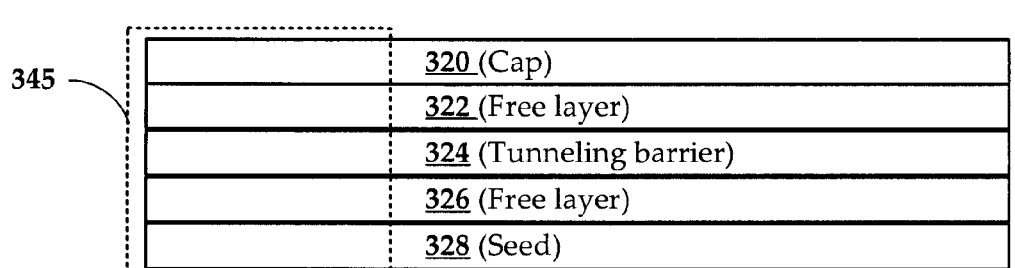

In an alternate embodiment, the various embodiments described herein may also be applicable to a tri-layer stack design. An example tri-layer stack 318 is shown in FIG. 3B. Tri-layer stack 318 differs from the TMR stack 300 in that stack 318 includes two free layers 322 and 324 and no reference layers (e.g., layers 308 and 310 shown in FIG. 3A). Stack 318 includes a cap layer 320 that contacts a top shield (not shown), a first free layer 322, an insulating layer/tunneling barrier 324 (which may also be a semi-conducting layer or a non-magnetic metal layer), a second free layer 326, and a seed layer 328, which may contact a bottom shield (not shown).

Magnetostatic interactions between the two free layers 322, 326 tend to align the magnetizations of the free layers in anti-parallel directions relative to each other in the absence of other external magnetic fields or forces. This anti-parallel alignment results in high resistance and low output. As a result, the two free layers 322, 326 are biased via a permanent magnet (not shown). This bias brings the free layers 322, 326 into orthogonal alignment relative to each other in the remnant state. As with stack 300, current flows top-to-bottom (or vice versa) through stack 318 to produce a read signal. Generally, the tri-layer stack 318 is biased perpendicularly at the edge opposite the air-bearing surface. However, the stack 318 may still be used with magnets that extend along a part of the stripe height, e.g., along a portion away from the air bearing surface.

Figure 3C:
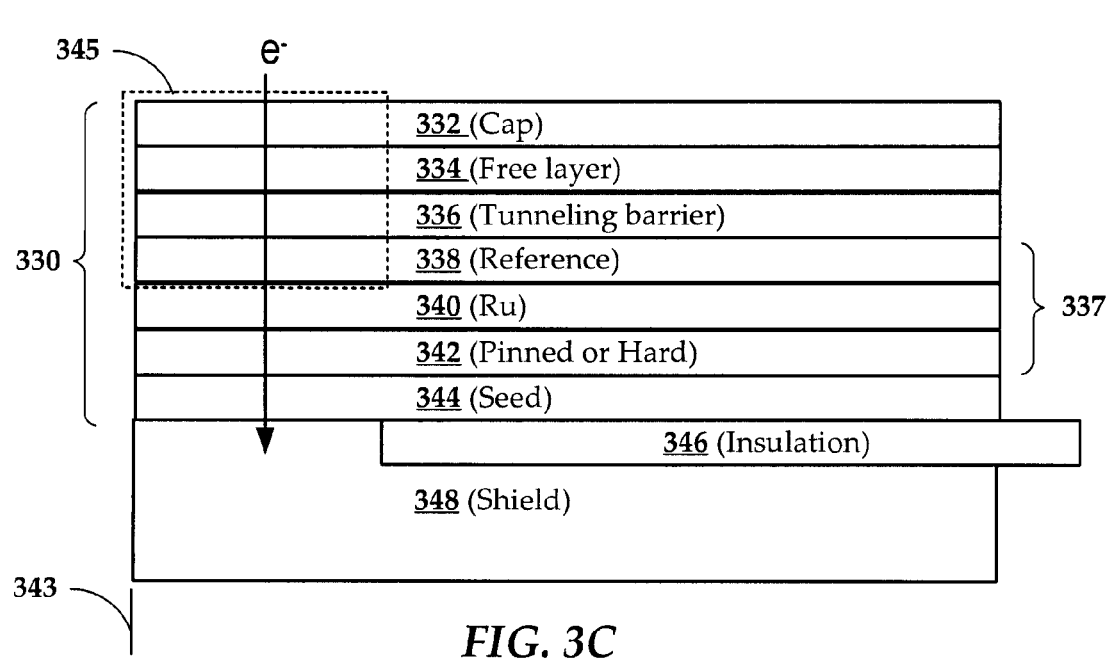

In reference now to FIG. 3C, a block diagram illustrates an alternate configuration of a GMR stack 330 according to an example embodiment. This stack 330 includes a cap 332, free layer 334, tunneling barrier 336, and seed layer 344 similar to those described above. Instead of using the pinned/reference layer 308 and AFM/pinning layer 310 as seen in FIG. 3A, however, this stack 330 utilizes a trilayer structure 337 known as a synthetic antiferromagnet (SAF).

The SAF 337 includes ferromagnetic reference and pinned layers 338, 342 separated by a thin nonmagnetic layer 240, which may be formed from, e.g., ruthenium (Ru). The SAF stack 330 is another option in reducing shield-to-shield spacing, which would result in reduced pulse width and higher linear density. Use of a long strip height design makes the SAF stack 330 more stable because the volume is bigger, and the back edge is far away from media field.

As with the other designs, the stack 330 is partially biased by a permanent magnet 345 proximate an air bearing surface 343. The magnet 345 is shorter than the stripe height, which reduces magnetic perturbations on SAF 337. Also seen in this view is the partial insulation layer 346 that lies between the stack 330 and bulk shielding 348. The insulation layer 346 constrains current go through the active region of the free layer 334 (on the order of 50 nm) so the amplitude can be as high as current reader designs, but the magnetic noise from free layer 334, and SAF layers 337 are lower for the same reason. Overall, this design could achieve both areal density gain and SNR gain, without having to trade off between these two characteristics.

In FIG. 3D, a block diagram illustrates an alternate configuration of a GMR stack 350 according to an example embodiment. The stack 350 includes some similar features of stack 330, and those features are identified using the same reference numbers used in FIG. 3C. In this example, a recessed layer of AFM 352 is placed between the SAF stack 337 and an insulation layer 356. A seed layer 354 is located between the AFM layer 352 and the insulation 356. All three layers 352, 354, 356 are surrounded by shield 358 at the bottom and at an end 360 of the layers 352, 354, 356 near the air bearing surface 343.

The AFM layer 352 is recessed from the air bearing surface 343. As a result, the shield-to-shield spacing may still remain small and thereby provide an increase in linear density. The recessed AFM 352 may help stabilize the pinned layer 342 of the SAF stack 337 and reduce noise from SAF 337. The recessed AFM 352 may also prevent SAF polarity flip during reader operation. The SAF orientation can be set through an exchange coupling between AFM surface 352 and pinned layer 342 during annealing. For SAF-only design, the SAF 337 orientation may be difficult to stabilize because a magnetic field is also used to set the field of permanent magnets in perpendicular direction to SAF 337 orientation, which will perturb the SAF 337 orientation. Recessing the AFM 352 may resolve this issue.

Another aspect of this design 350 is shown in front views of stacks 350A and 350B shown in FIGS. 3E and 3F. The stacks 350A, 350B (or free layers within the stacks) are wider at a back edge opposite the air bearing surface 343. The widened stack can be any shape, and stacks 350A and 350B are provided as examples. These configurations 350A, 350B increase the volume of FL/SAF/AFM at the back edge, so they may be more stable. The insulation layer (e.g., layer 356 in FIG. 3D) underneath this portion of the reader stack is intended to minimize signal drop because of back edge shunting effects, as current does not go through this portion. This design may also provide noise reduction and stability improvement. For example, flipping of magnetic orientation in the free layer may be prevented (see the discussion of flipping of magnetic orientation in the discussion of FIG. 5A below).

In these and other embodiments, the reader includes a stack structure with at least one elongated free layer that is biased by a permanent magnet. Unlike previous design, the permanent magnet may be arranged to only bias a portion of free layer(s), e.g., a portion proximate the air bearing surface. The elongated shape of the stack ensures greater stability due to increased area and better coupling between the layers. Further, by biasing only a portion of the free layers, the resistance of the stack is reduced, resulting in improved SNR of the reader.

Figure 4A:
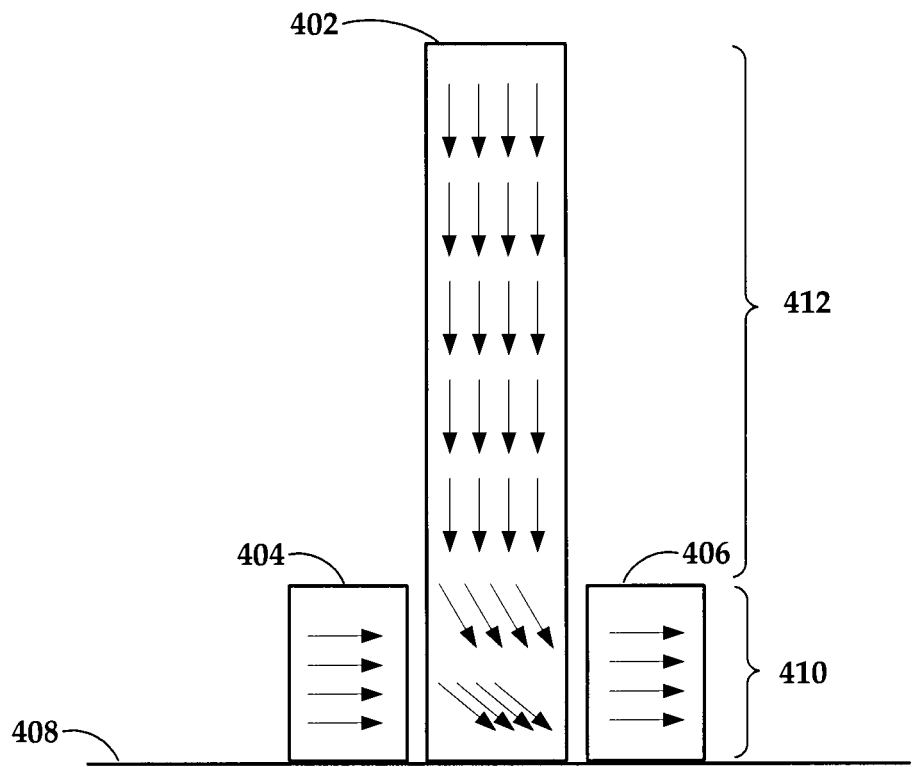
FIG. 4A is a block diagram illustrating how partial biasing may affect a free layer in an MR reader stack according to an example embodiment.

In reference now to FIG. 4A, a block diagram illustrates an example of how partial biasing may affect a free layer 402. Two permanent magnets 404, 406 are positioned beside the free layer 402 near an air bearing surface 408. As indicated in the lower portion 410 of the free layer 402, the magnetic flux will bend towards the in-plane direction close to the air bearing surface 408. Depending on the detailed aspect ratio and the height of the permanent magnets 404, 406 above the air bearing surface 408, the lines of flux in the upper portion 412 of the free layer 402 remain stably perpendicular to the air bearing surface 408 in the quiescent state due to magnetostatic and exchange couplings.

For this design, the top portion 412 of the reader will remain unchanged in the playback process. This results in the total resistance of the reader being reduced in a similar way as reader shunt. However, use of a shunt may, in contrast to the present approach, reduce the SNR because the loss of signal due to the shunt may be faster than the reduction of reader noise. In the proposed structure, the amplitude will be reduced, but at a slower rate than the reduction of noise. As a result, the overall SNR will increase and the overall resistant can be managed to be within optimal region even at high areal density beyond 1 Tb/in$^2$ (e.g., where reader width is less than 25 nm).

Figure 4B:
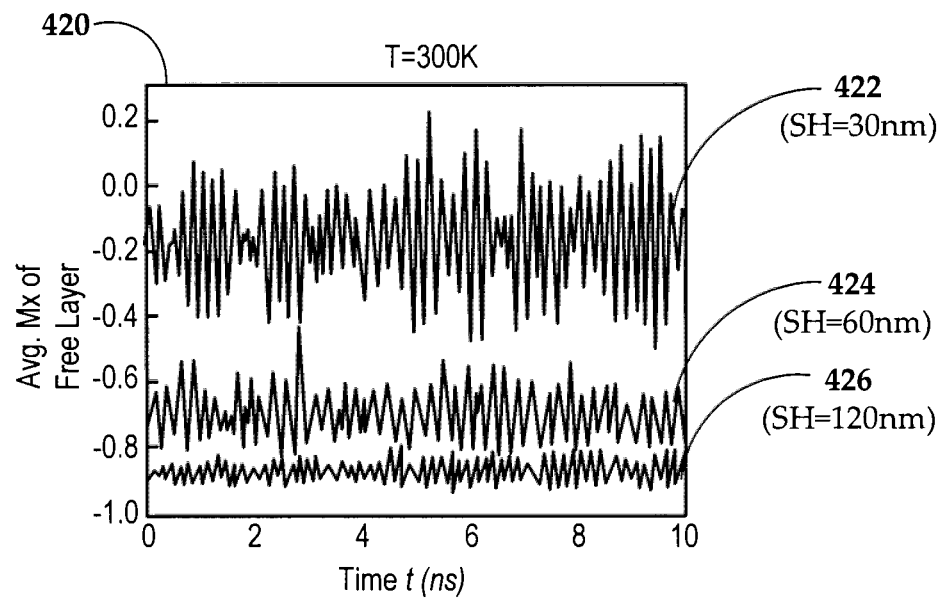
FIG. 4B is a graph showing simulated free layer magnetic noise for MR reader stack aspect ratios according to example embodiments.

The top portion 412 is located away from the air bearing surface 408, and as a result the free layer 402 may have a larger magnetization rotation angle due to the reduction of magneto-static coupling due to the shape change. Therefore, overall SNR will increase. In FIG. 4B, a graph 420 shows free layer magnetic noise for a number of different reader aspect ratios. The plots 422, 424, and 426 illustrate time-varying noise levels for respective stripe heights of 30 nm, 60, nm, and 120 nm, where a reader width of 20 nm is assumed. In these plots 422, 424, and 426, a permanent magnet height (e.g., dimension 410 shown in FIG. 4A) is assumed to be 30 nm. Accordingly, this graph 420 illustrates a reduction in noise that may be seen for free layers having increasingly larger aspect ratio (reader stripe height versus reader stripe width) and correspondingly smaller region of the free layer(s) that are proximate to a permanent magnet. Although this graph 420 only shows reduction in magnetic noise, the results are similar for other sources of electronic noise (e.g., Johnson noise).

Figure 5A:
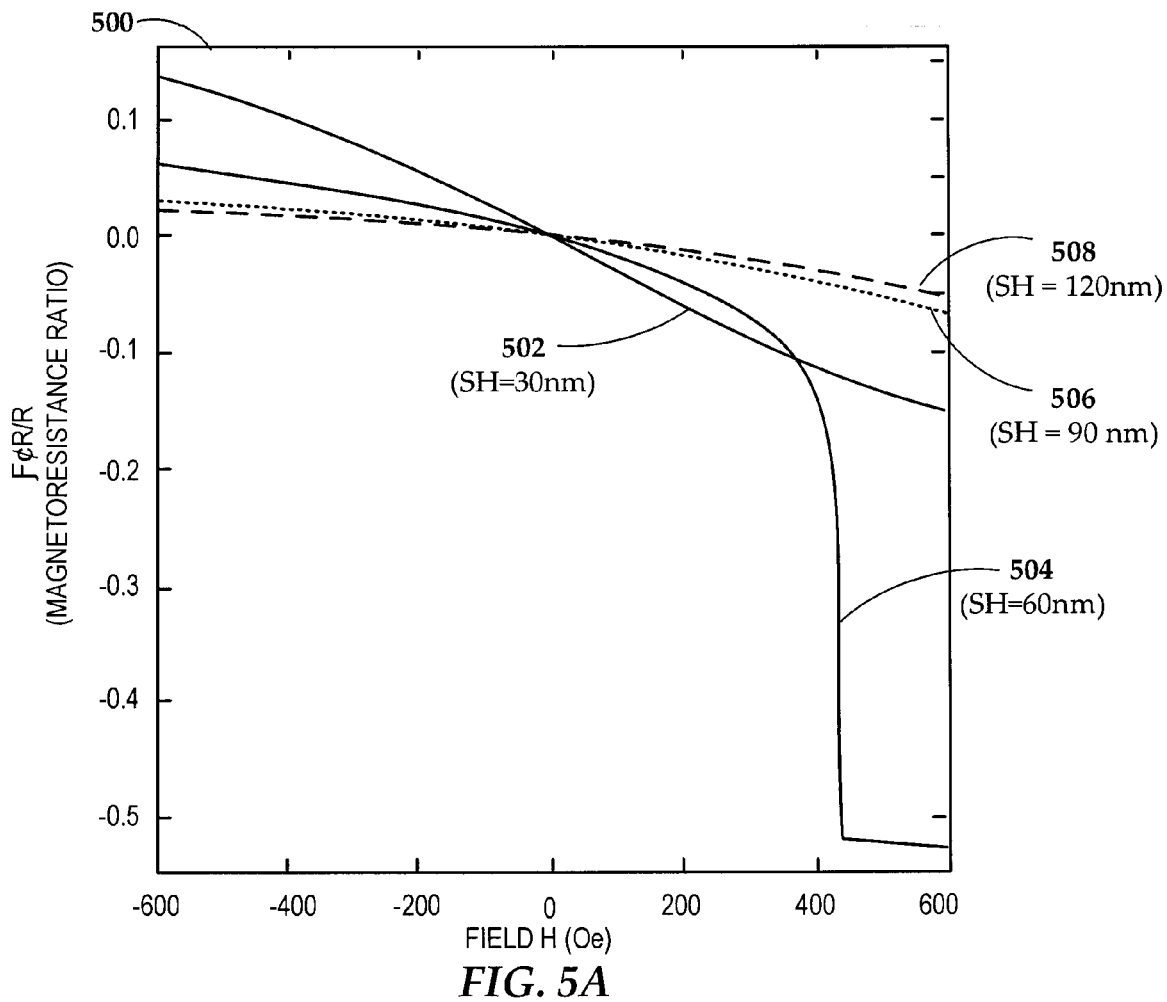
FIG. 5A is a graph of simulated transfer curves for MR stripe heights according to example embodiments.
Figure 5B:
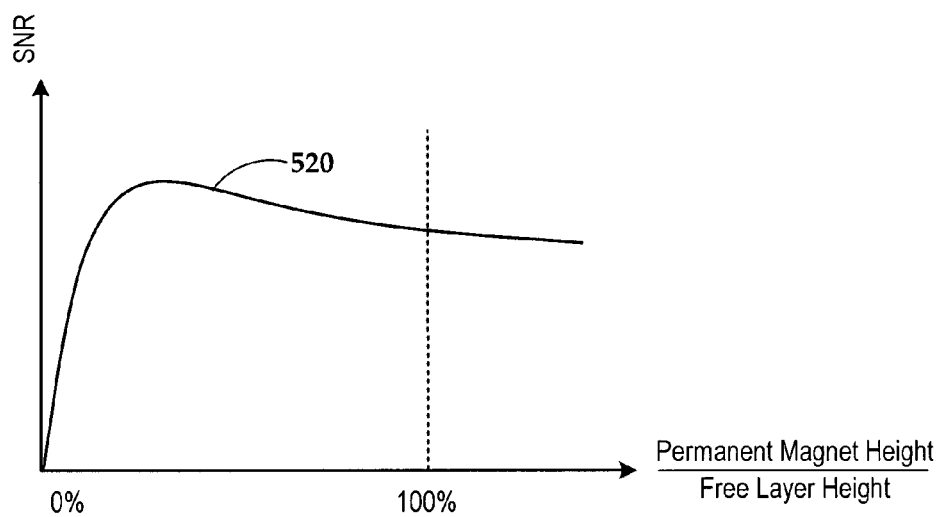
FIG. 5B is a graph is estimated signal-to-noise ratio as a function of the height ratio of permanent magnet to free layer height of MR readers according to example embodiments.

In reference now to FIG. 5A, a graph 500 illustrates simulated transfer curves for a number of different stripe heights. The transfer curves 502, 504, 506, and 508 indicate relative signal outputs for stripe heights of 30 nm, 60 nm, 90 nm, and 120 nm, respectively. As before, a reader width of 20 nm and permanent magnet height of 30 nm is assumed. While signal output decreases for larger aspect ratios, there is a region where noise decreases greater than the signal output, thereby resulting in a higher SNR. This is summarized as curve 520 shown in FIG. 5B, where a peak in SNR can be seen where permanent magnet height is approximately 20-40% of the free layer height. A discrete listing of some of these results is also shown in TABLE 1 below.

TABLE 1

SNR Gain for Increased Aspect Ratio Reader with Partial Bias

| Reader Width (nm) | Stripe Height (nm) | Stripe Height/ Permanent Magnet Height | SNR gain (free layer magnetic noise only) |
|---|---|---|---|
| 20 | 30 | 1 | 0.0 dB |
| 20 | 90 | 3 | 0.2 dB |
| 20 | 120 | 4 | 0.1 dB |

These results generally show that, if permanent magnet height is set to a certain percentage of the free layer height, then the optimal permanent magnet depth should be at a fraction of the free layer throat height. e.g., this percentage is less than 100%. In reference again to FIG. 5B, where the permanent magnet ratio is 0%, the bias from the magnet is also zero. In such a case, there will be little or no amplitude from the reader, yet noise (e.g., magnetic noise, Johnson noise) is still large. As PM depth increases, the SNR continues to increase. As the permanent magnet height approaches and exceeds the size of the free layer, the SNR actually becomes smaller. This is because amplitude is reduced with increased permanent magnet strength, but the reader noise is not further reduced. Therefore, in this example configuration, the peak SNR occurs when permanent magnet height is different from (e.g., less than) the free layer height.

In reference again to FIG. 5A, the behavior of curve 504 at the right end of the scale now further discussed. For this stripe height (60 nm) an extreme change in magnetoresistance ratio is seen at approximately 400 Oe and above. This result is due to the magnetization of the back edge of the free layer (e.g., region 412 in FIG. 4A) reversing direction in response to a sufficiently strong magnetic field near the air bearing surface. This causes this portion of the free layer to change from an anti-parallel to parallel orientation relative to the reference layer. Therefore, if the reader aspect ratio is not big enough, this portion of the free layer (and/or the reference layer) or may flip magnetization given a large enough external fields. If the aspect ratio is large, the required field to cause this flip is increased significantly, thereby decreasing the likelihood that such a flip occurs.

It should be noted that the approaches described above can, in principle, be applied to different situations. For example, the different reader stack designs may have increased performance from a reduced permanent magnet height. A reader stack may include, in addition to a free layer and a spacer layer, a pinned layer and synthetic antiferromagnet (SAF). Or, as described above, a trilayer design with two free layers may use partial magnetic biasing. The magnetic biasing arrangement in all of these cases may also include a difference in permanent magnet layer thickness compared to stack thickness.

A number of performance enhancements may be expected for a partially biased, high aspect ration MR reader. First, this reader approach may minimize penalties as reader resolution increases. Since the reader size can be increased while still retaining smaller reader width, a thinner reference layer, free layer, pinned layer, and/or antiferromagnet (AFM) layer can be utilized, thus enabling reduction of the shield-to-shield spacing. Further, since both sides of active region close to the ABS are PM biased, the top regions that exceed PM level can be AFM pinned and exchange coupled. Therefore, the reader structure only has one free boundary that responds to an external bias field: the air-bearing surface side. This structure may enable a reduction of reader noise as compared to conventional designs.

In addition, since only the portion close to air-bearing surface is active, there is no additional spacing loss. The rotational region is close to the air-bearing surface, which gives good playback resolution. If a large aspect ratio but fully permanent magnet biased free layer is utilized, the whole free layer can respond. In such a case, the response from top portion of the reader will lower the reader resolution due to finite spacing loss. Therefore, this reader may not lead to significant $MT_{10}$ penalties (e.g., distance of reader from magnetic track on media at which the reader's signal decreases to 10 percent of its maximum), as might a fully-biased, large aspect ratio reader.

Figure 6:
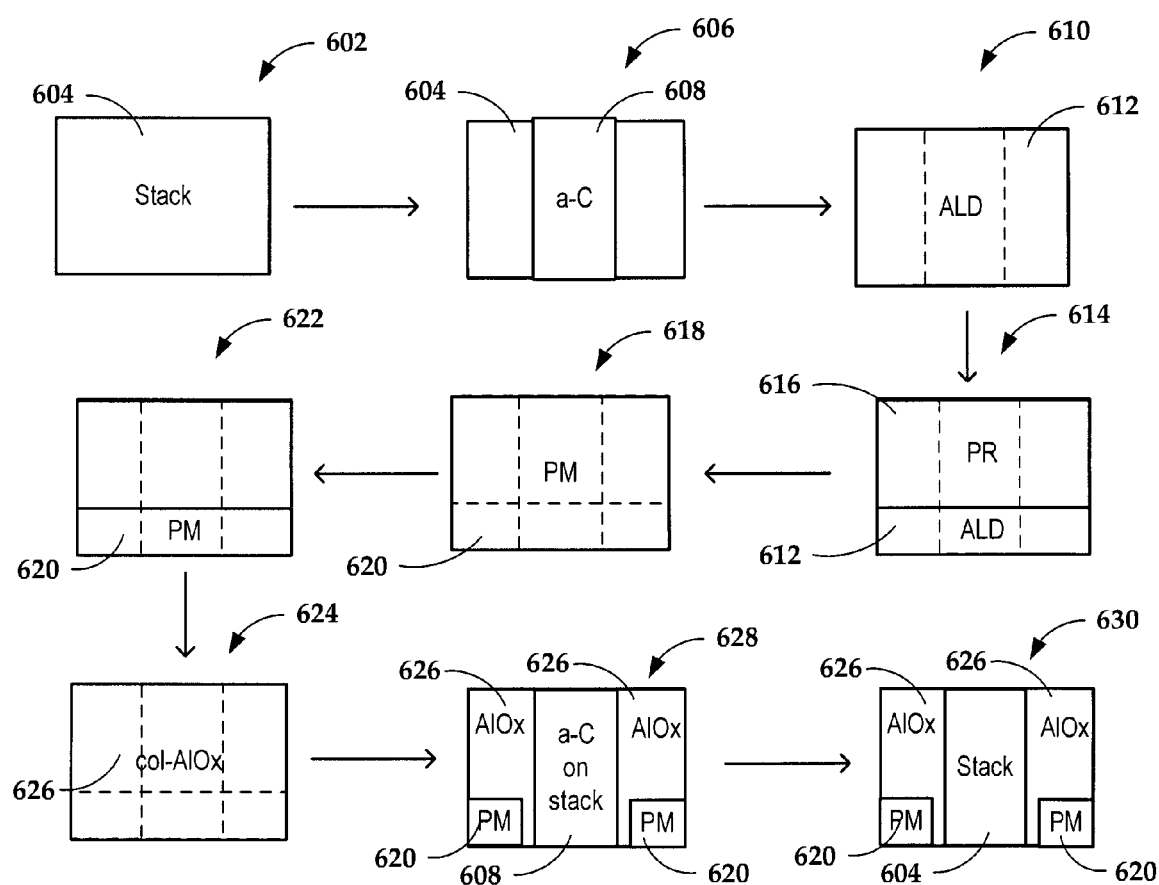
FIG. 6 is a block diagram illustrating a procedure for forming portions an MR reader assembly according to an example embodiment.

In FIG. 6, a block diagram illustrates a procedure for forming a reader assembly according to an example embodiment. Generally, the process begins at stage 602 by depositing layers (e.g., upon a base substrate) that will form the reader stack 604 (e.g., layers shown in examples of FIGS. 3A and 3B). At stage 606, the shape of reader stack 604 is defined using hard mask process, e.g., using a deposit of amorphous carbon (a-C) 608 as illustrated. As seen in the diagram, the hard mask 608 defines an elongated stack along the down track direction, thereby defining the reader width. The hard mask 608 can act as a stop layer for subsequent steps involving chemical mechanical polishing/planarization (CMP).

At stage 610, the stack materials have been removed, except for stack material disposed under the a-C mask 608. Also at stage 610, an electrical insulator material 612 such as alumina has been deposited, e.g., via atomic layer deposition (ALD) over the entire area. The insulator material 612 covers both edges of the stack, the hard mask and field areas on either side of the stack. At stage 614, a photo resist 616 has been applied to partially cover the illustrated area. The photo resist 616 protects areas where permanent magnet (PM) material is designed. The position of the lower edge of the photo resist 616 can be adjusted so that different biased/unbiased stripe ratios can be achieved.

At stage 618, permanent magnetic material 620 has been applied over the entire area of interest. At stage 622, the photo resist has been lifted off in order to remove the PM material from areas where PM bias is not designed. At stage 624, collimated alumina 626 has been deposited over the entire area of interest. At stage 628, CMP is applied to the entire surface to make the collimated alumina co-planar with the permanent magnet and hard mask 608 on top of the stack. The CMP also removes portions of the PM material and alumina ALD 612 that were deposited over the stack. Finally, at stage 630, the hard mask materials have been removed to expose the stack 604. At this state, the stack and surrounding areas may be subject to other standard MR processes, such as top shield deposition.

Figure 7A:
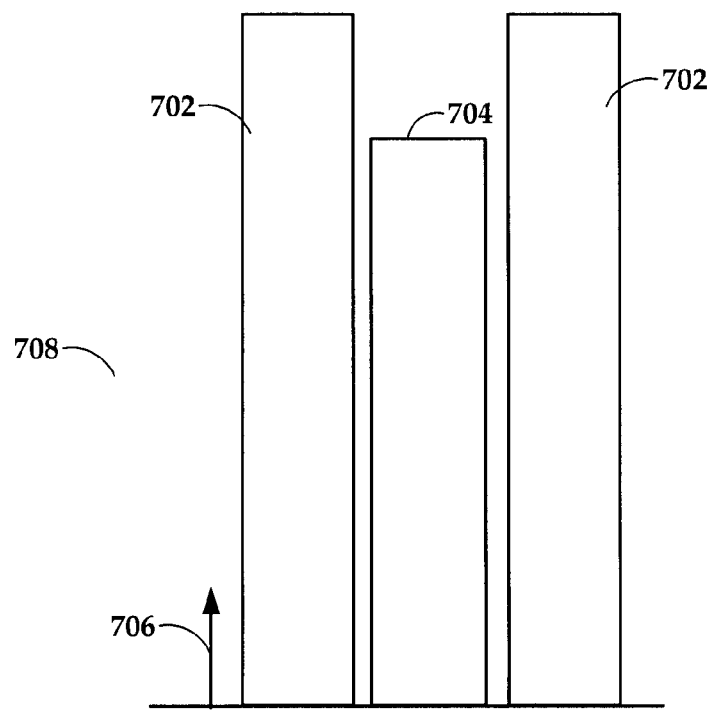
FIGS. 7A and 7B show respective elevational views of exemplary arrangements of a reader stack and a permanent magnet in accordance with some embodiments.

In the MR reader designs, it has been found that a permanent magnet having a lower height than the stack provides at least reduced SNR. However, it may be that for other stack designs, signal will increase faster than noise as permanent magnet height meets (and possibly exceeds) the height of the stack. This may be visualized by referring again to FIG. 5B. In this theoretical case, the curve 520 may be shifted to the right so that the peak of the curve 520 occurs to the right of the 100% mark. In such a case, a configuration such as shown in FIG. 7A may be beneficial. In FIG. 7A, permanent magnets 702 are larger than reader stack 704 along a dimension 706 that extends out-of-plane in any direction away from air bearing surface 708 (or other, media-proximate surface).

Figure 7B:
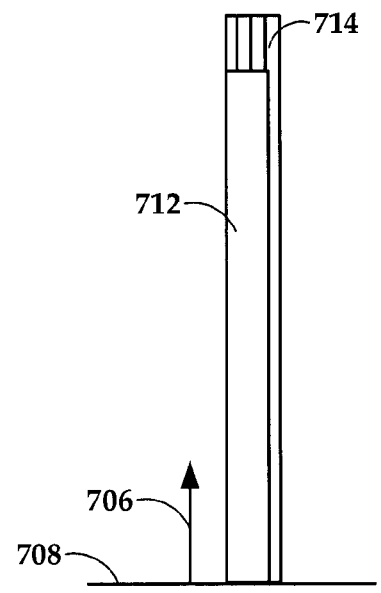

In other embodiments, there may be differences between the thickness of the permanent magnet layers and the reader stack. This can be seen in FIG. 7B, which illustrates a stack biasing arrangement according to another example embodiment. In this embodiment, one or more permanent magnets 712 have a smaller thickness than reader stack. In this example the height along dimension 706 is also smaller than the height of the stack. It will be appreciated that one of the thickness and height of the magnet 712 may alternatively be larger than equivalent dimensions of the stack 714 while the other is smaller.

Figure 8:
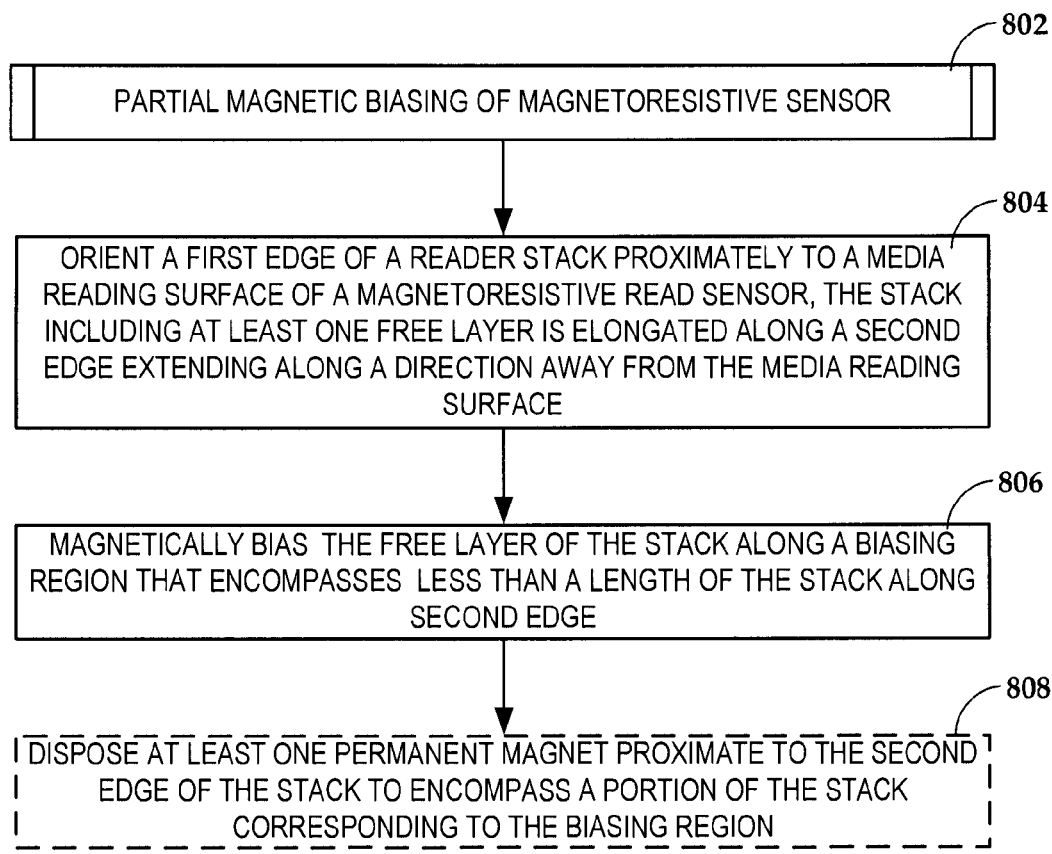
FIG. 8 is a flowchart illustrating a procedure according to an example embodiment.

In reference now to FIG. 8, a flowchart illustrates a procedure 802 for partial magnetic biasing of a magnetoresistive sensor. The procedure 802 involves orienting 804 a first edge of the reader stack proximate to a media reading surface of a magnetoresistive read sensor. The stack includes at least one free layer is elongated along a direction away from (e.g., in a direction normal to, or at some other angle relative to) the media recording surface. A portion of the free layer is magnetically biased 806 along a biasing region that is less that the length of the stack along the second edge. This biasing 806 may involve, for example, disposing 808 at least one permanent magnet proximate to the second edge of the stack to encompass a portion of the stack corresponding to the biasing region.

The foregoing description of the example embodiments has been presented for the purposes of illustration and description. It is not intended to be exhaustive or to limit the inventive concepts to the precise forms disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A sensor, comprising:
a magnetoresistive stack with a first stripe height as measured orthogonal to an air bearing surface (ABS) of the magnetoresistive stack; and
a biasing magnet positioned adjacent the magnetoresistive stack and having a second stripe height, the second stripe height measured orthogonal to the ABS and being less than the first stripe height, the first and second stripe heights corresponding to a minimum signal to noise ratio in the magnetoresistive stack.

2. The sensor of claim 1, wherein the magnetoresistive stack has a plurality of magnetic free layers biased to a default magnetization by the biasing magnet.

3. The sensor of claim 1, wherein the magnetoresistive stack and biasing magnet are on an air bearing surface.

4. The sensor of claim 1, wherein the first and second stripe heights form a predetermined ratio that is greater than or equal to 2.

5. The sensor of claim 1, wherein the first and second stripe heights form a predetermined ratio that is greater than or equal to 3.

6. The sensor of claim 1, wherein first stripe height is 60% to 80% greater than the second stripe height.

7. The sensor of claim 1, further comprising a second biasing magnet adjacent the magnetoresistive stack and configured with a third stripe height.

8. The sensor of claim 7, wherein the third stripe height is equal to the second stripe height.

9. The sensor of claim 1, further comprising an insulating layer disposed between the magnetoresistive stack and a shield.

10. The sensor of claim 1, wherein the biasing magnet has a first width that is less than or equal to a second width of the magnetoresistive stack.

11. A method comprising:
positioning a magnetoresistive stack with a first stripe height, as measured orthogonal to an air bearing surface (ABS) of the magnetoresistive stack, adjacent a biasing magnet having a second stripe height, the second stripe height measured orthogonal to the ABS and being less than the first stripe height; and
selecting the first and second stripe heights to correspond to a minimum signal to noise ratio in the magnetoresistive stack.

12. The method of claim 11, wherein the minimum signal to noise ratio is in response to an encountered external data bit.

13. The method of claim 11, wherein the first and second stripe heights form a biasing region proximal to the ABS.

14. The method of claim 13, wherein the biasing region extends from the ABS approximately to the second stripe height.

15. The method of claim 11, wherein the difference between the first and second stripe heights defines a magnetic shunt portion of the magnetoresistive stack.

16. The method of claim 11, wherein the stack biasing magnet induces a default magnetization in the magnetoresistive state.

17. An apparatus comprising:
a magnetoresistive stack positioned on an air bearing surface (ABS) with a first stripe height as measured orthogonal to the ABS; and
a first biasing magnet positioned adjacent the magnetoresistive stack on the ABS and having a second stripe height, the second stripe height measured orthogonal to the ABS and being less than the first stripe height; and
a second biasing magnet positioned adjacent the magnetoresistive stack on the ABS having a third stripe height, the third stripe height measured orthogonal to the ABS and being less than the first and second stripe heights, the first, second, and third stripe heights corresponding to a minimum signal to noise ratio in the magnetoresistive stack.

18. The apparatus of claim 17, wherein the second biasing magnet is on an opposite side of the magnetoresistive stack from the first biasing magnet on the ABS.

19. The apparatus claim 17, where the a first differential is the difference between the first and second stripe heights and a second differential is the difference between the first and third stripe heights, where each differential is measured orthogonal to the ABS.

20. The apparatus of claim 19, wherein the second and third stripe heights are each 20-40% of the first stripe height.

* * * * *